United States Patent [19]

Corbin et al.

[11] 4,070,501

[45] Jan. 24, 1978

[54] FORMING SELF-ALIGNED VIA HOLES IN THIN FILM INTERCONNECTION SYSTEMS

[75] Inventors: Vivian Ruth Corbin, Wappingers Falls; James Edward Hitchner, Poughkeepsie; Bisweswar Patnaik; Chung-Yu Ting, both of Wappingers Falls, all of N.Y.

[73] Assignee: IBM Corporation, Armonk, N.Y.

[21] Appl. No.: 736,615

[22] Filed: Oct. 28, 1976

[51] Int. Cl.² ........................................... H01L 21/44
[52] U.S. Cl. ....................................... 427/88; 427/93; 427/96; 156/643; 156/652; 156/653; 156/657; 156/662; 204/192 D; 96/36.2
[58] Field of Search .................... 427/84, 88, 89, 90, 427/91, 92, 93, 94, 95, 96, 259, 271, 273, 331, 335, 336; 156/653, 643, 644, 645, 652, 654, 656, 657, 662; 96/36, 36.2; 204/192 D, 192 EC, 192 E, 192 S

[56] References Cited

U.S. PATENT DOCUMENTS 3,976,524 8/1976 Feng ................................. 427/93 X Primary Examiner—Ralph S. Kendall
Attorney, Agent, or Firm—Thomas F. Galvin

[57] ABSTRACT

A method for forming self-aligned via holes which are used to interconnect levels of thin films atop substrates. A first level thin film pattern, typically comprising raised metallic stripes, is formed atop the substrate. A first level dielectric material is then deposited in blanket fashion so that the topology of the insulator conforms to the topology of the pattern. Next, a material such as polymer is deposited which tends to form a planar surface, with a greater thickness of polymer accumulating between the protuberances of the insulator than atop said protuberances. A mask is then applied, exposed and developed at selected regions where via holes are to be formed in the dielectric. A small amount of the polymer is etched, preferably in a plasma, to expose the insulator. Then the latter is etched to form the via holes. Accurately located via holes are formed, even if the mask is misaligned.

14 Claims, 15 Drawing Figures

FORMING SELF-ALIGNED VIA HOLES IN THIN FILM INTERCONNECTION SYSTEMS

BACKGROUND OF THE INVENTION

1. Field of the Invention

This invention relates to the fabrication of thin film patterns on substrates. More particularly, it relates to the fabrication of metallurgy interconnection systems atop semiconductor devices.

2. Description of the Prior Art

Advances in modern semiconductor device technology have allowed increasing numbers of devices and circuits to be fabricated within a single semiconductor chip. This has required increasing microminiaturization of both the semiconductor elements as well as the interconnection metallurgy which connect the elements within the chip into circuits. Such miniaturization results in decreased costs and improved performance in integrated circuits; but it is constantly crowding the fabrication technology, particularly the photolithographic and etching techniques of the interconnection metallurgy.

In integrated circuit logic and memory design, for example many thousands of impurity regions are conventionally fabricated in a silicon chip approximately 125–200 mils square. Such regions form transistors, diodes, resistors and the like which are then connected together by the metallurgical patterns atop the chip to form various circuits and for connection to input-output terminals.

This interconnection metallurgy system atop the chip is extremely complex and usually employs two or three separate levels of complex thin film conductor patterns, each separated by one or more layers of dielectric material. Ordinarily, the first level conductive pattern on the chip surface interconnects the transistors, resistors, diodes, etc. into circuits and also provides for circuit-to-circuit connections. The latter function is usually provided by parallel conductive lines connected to the individual circuits. The second level conductive pattern conventionally completes the circuit-to-circuit connection and makes contact to I/O terminals which are connectable to a support such as a module, substrate or card. The second level usually consists of parallel lines that are transverse to the aforementioned parallel lines of the underlying first level conductive pattern. In advanced designs third, and even fourth, levels may be required for power and I/O connections.

The area occupied within the semiconductor chip by the impurity regions which make up the active and passive semiconductor devices actually occupies substantially less than the total available chip area. The support area required by the metallurgy is the limiting factor in determining the number of circuits which can be utilized on a chip.

At the present state of technology, the lower limits of the width of an interconnection metallurgy stripe are usually thought to be imposed primarily by photolithographic technology. The line widths are in the order of 0.15 mils with a separation on the order of 0.15 mils for long lines. However, a more severe restriction exists when conventional techniques are used to form multilevel conductive patterns.

At present it is necessary to etch the dielectric layers to form feedthrough patterns from one level to another. The standard process of interconnecting one level of metallurgy to another involves depositing an insulator such as $SiO_2$ atop a first level metallurgical pattern disposed on a substrate. The glass is typically deposited pyrolytically, although the sputtered glass position process described in U.S. Pat. No. 3,983,022 of Auyang et al, is more advantageous. Said patent is assigned to the same assignee as the present application.

A photo-resist layer is then deposited, exposed and developed so that the via hole pattern is formed in the photoresist over the glass. The exposed glass portions are then etched to form the via holes down to the first level metallurgy. A second level metallurgical pattern is then deposited atop the remaining glass layer and into the via holes for connection to the first level pattern.

A critical step in the process involves the alignment of the photoresist mask with the first level pattern. Misalignment of the mask may result in etching the insulative substrate beneath the glass layer, commonly termed overetching. In addition, overetching may result in the removal of the glass between conductive stripes in the metallurgical pattern. To compensate for such contingencies, it is common to provide increased areas of metallurgy, termed pads, at via hole sites. These pads do effectively prevent overetching; but they also substantially increase the chip area required for interconnection metallurgy.

It is ordinarily necessary to provide for the possibility of locating two via holes in adjacent parallel lines in side-by-side relation on the substrate. Photolithographic and masking technology requires that the diameter of a via hole at the top of the dielectric or insulating surface be at least 0.25 mils. A conventional pad which interconnects levels of metallurgy must be wider than (overlap) the via hole by at least 0.40 mils or else a sharp-pointed, upperly-extended lip occurs about the via hole which is detrimental to mask life. It is also difficult to deposit a layer of metal or glass over the pad. This requires that the pads have a diameter of 0.65 mils. Because adjacent pads must be located at least 0.2 mils apart, the minimum center-to-center spacing between two parallel, adjacent conductive stripes is of the order of 0.85 mils. In an ideal structure, i.e., one which did not require pads over the via holes, the stripes could be spaced a at 0.45 mils center-to-center distance. In addition, the via connections could be as wide, or slightly wider than, the conductive stripe to which they are connected. This is termed a "zero-overlap" via.

One solution to these problems is found in U.S. Pat. No. 3,844,831 issued in the names of E. E. Cass et al., and assigned to the same assignee as the present invention. The Cass et al. technique involves the use of dielectric layers of dissimilar etching characteristics, whereby an etchant which attacks one type of dielectric does not substantially affect the other. Although the Cass et al. invention has been successful, it involves more fabrication steps and more complicated processing than the standard process.

Another method for forming via holes, described in U.S. Pat. No. 3,804,738 by Lechaton et al, involves planarizing the insulation disposed over narrow conductive stripes by sputtering, followed by etching the via holes in the planarized insulator down to the stripes. Although effective in reducing reliability problems, the Lechaton et al planarization process is time-consuming; in addition, some degree of overetching is ordinarily required to compensate for mask misalignment.

SUMMARY OF THE INVENTION

Accordingly, it is a primary object of our invention to improve the method for forming via connections between levels of thin film patterns.

It is another object of our invention to provide improved techniques which result in reducing the area required for wiring patterns atop semiconductor chips.

It is yet another object of our invention to provide an improved method for achieving "zero-overlap" via connections.

It is a further object of our invention to form "self-aligned" via holes without the need for planarizing the dielectric layer.

These and other objects of our invention are achieved by forming via holes atop a thin film pattern which are properly aligned, irrespective of whether the mask used to delineate the via holes is aligned properly or not.

In the process a first level of dielectric material is deposited in blanket fashion atop a raised thin film pattern so that the topology of the dielectric material conforms to the topology of the pattern. Preferably, the dielectric is glass which is deposited by conventional R.F. or D.C. sputtering so as to form protuberances over the raised pattern.

A material is then deposited which tends to form a more planar surface, with a greater thickness of the material accumulating between said protuberances of the dielectric than atop the protuberances. The material is preferably a polymer such as a conventional photoresist which is made insensitive to exposure.

A mask, preferably photoresist, is then applied, exposed and developed at selected regions over the protuberances where via holes are to be formed in the glass. A small amount of the polymer is etched, preferably in an oxygen plasma, to expose the dielectric, which is then chemically etched to form the via holes. Accurately located via holes are formed even if the mask is misaligned.

The process is extendible to multiple levels of thin film patterns.

DESCRIPTION OF THE PREFERRED EMBODIMENT

Figure 1A:
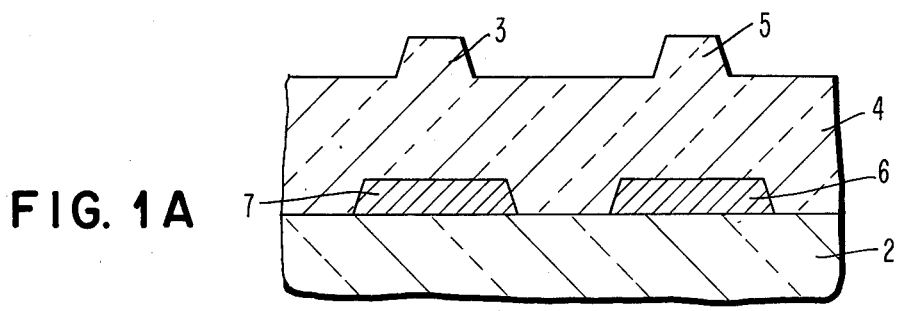
FIGS. 1A–1G are diagrammatic, cross-sectional views of a structure being fabricated in accordance with the preferred embodiment of our invention.

Turning now to the drawing, FIG. 1A shows a cross-section of thin metallic films 6 and 7 of approximately 1 micron in thickness disposed atop insulative substrate 2 and covered by dielectric material 4 having a thickness, e.g., of around 2 to 2½ microns. Films 6 and 7 comprise a portion of a first level conductive pattern which is generally interconnected through substrate 2 to doped impurity regions within a semiconductor substrate (not shown). Films 6 and 7 are also interconnected to other such films in said pattern on the same level to form device-to-device and circuit-to-circuit interconnections, as is well known in the art.

One technique for depositing thin films 6 and 7 on substrate 2 corresponds to the basic method described in U.S. Pat. No. 3,873,361 entitled "Method of Depositing Thin Film Utilizing A Lift-Off Mask" in the names of Franco et al. Other techniques could be used as well. For example, the technique described in the application of Franco et al., Ser. No. 576,054 filed May 9, 1975, now U.S. Pat. No. 4,004,044, entitled "A Method for Forming Patterned Films Utilizing a Transparent Lift-Off Mask" or the technique described in application Ser. No. 448,327, filed Mar. 5, 1974, now U.S. Pat. No. 3,982,943, in the names of Feng et al., entitled "A Lift-Off Method of Fabricating Thin Films In a Structure Utilizable As A Lift-Off Mask" could be used. Each of these applications is assigned to the assignee of the present invention.

Our preferred lift-off process is that described in the copending application of J. R. Franco et al., Ser. No. 576,054 filed May, 9, 1975, now U.S. Pat. No. 4,004,044, and entitled "A Method For Forming Patterned Films Utilizing A Transparent Lift-Off Mask". Briefly, this method comprises the deposition of a first organic polymeric masking layer on substrate 2 which is then baked to improve adhesion and thermal stability. A polydimethylsiloxane resin layer having a preponderence of Si—O bonds relative to Si—$CH_3$ bonds is spun-on over the polymeric layer. A second masking layer, which may be photoresist or an electron-beam resist, is placed on the resin layer. The second masking layer is patterned using standard photo-or-electron-beam lithographic techniques to expose portions of the resin layer in the desired pattern. Using the patterned second masking layer as a mask, openings are reactively-sputter-etched in the resin layer using a fluorine gas ambient. Then, conforming openings are made in the first masking layer by a second reactive-sputter-etching step in the same sputtering chamber using an oxygen gas ambient instead of the fluorine gas ambient. Thin metallic films 6 and 7 are then blanket-deposited atop the resin and in the first masking layer openings atop substrate 2. The first masking layer is then removed, causing that portion of the thin film atop the resin to be lifted off. Overetching of the first masking layer produces an overhang of the openings in the overlying polydimethysiloxane resin layer which facilitates easy lift-off of the unwanted portions of the finally-deposited thin films 6 and 7.

Other techniques besides lift-off could be used. For example, standard reactive ion etching or sputter etching techniques might also be used, although they are less feasible at the present time. Such techniques generally comprise depositing blanket layers of the metal film atop substrate 2, applying an appropriate photoresist, developing the photoresist as a mask for the desired pattern and removing the unwanted metal by reactive ion etching or sputter etching where the photoresist has been removed.

Films 6 and 7 preferably comprise aluminum, aluminum-copper alloys or aluminum-copper-silicon. Other conductive films could be used.

Dielectric layer 4 is preferably glass which is formed by conventional R.F. or D.C. sputtering techniques so as to conform topologically to the thin film pattern atop the substrate. Protuberances 3 and 5 are thereby formed over stripes 7 and 6, respectively, having a thickness corresponding to the thickness of the stripes. Their existence is important to our process. The protuberances are much less pronounced when the glass is vapor deposited rather than sputtered; and the latter technique is therefore more desirable. The flat protuberances in the Figures are illustrated as less wide than their associated stripes. This configuration is achieved by using the resputtering technique described in the aforementioned Auyang et al U.S. Pat. No. 3,983,022. In fact, it is desirable to resputter the glass in order to reduce the width of the protuberances. This provides better control of the width of the subsequently-formed via holes.

The upper surfaces of protuberances 3 and 5 need not be flat. Instead, they may be peaked, which can also be accomplished by using the resputtering technique described in the aforementioned Auyang et al Patent.

It is not necessary that the height of the protuberances equal the height of a conventional stripe 7. For example, we have formed self-aligned via holes when the protuberances were as low as 0.5 microns high, although this is probably not the lower limit.

Figure 1B:
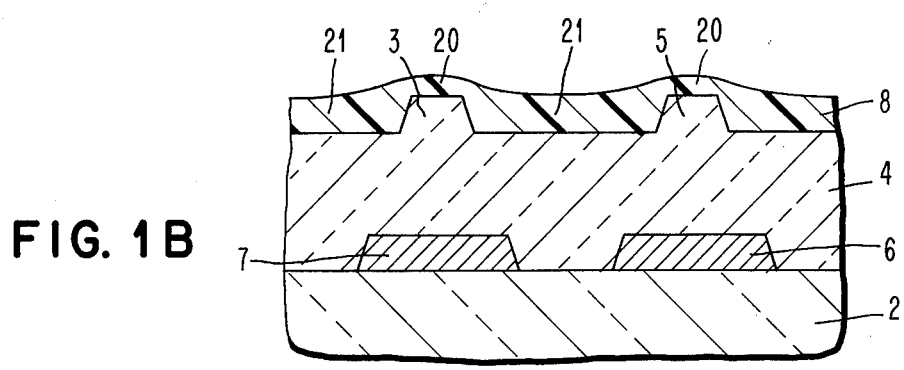

After the deposition of dielectric layer 4, a polymer 8 is deposited which forms a more planar upper surface than the upper surface of layer 4, as illustrated in FIG. 1B. In our preferred embodiment, a commercially-available photoresist is spun-on so that more of it is built up in the regions between protuberances 3 and 5 than atop the protuberances. Photoresist 8 is then baked so that it is no longer sensitive to exposure. It may be any one of a number of commercially available photoresists such as AZ 1350J, AZ 111 or AZ 1350H, each of which is available from the Shipley Company. In addition, polysulfone may be used with good results.

A significant feature with regard to the topology of layer 8 is the difference between the thickness of polymer 8 atop protuberances 3 and 5 and its thickness in the areas between the protuberances. Typically, the thickness at regions 21 is around 0.4 microns and the thickness at regions 20 is less than 0.1 micron. In general, the higher the protuberances, the greater is the thickness differental of layer 8.

Figure 1C:
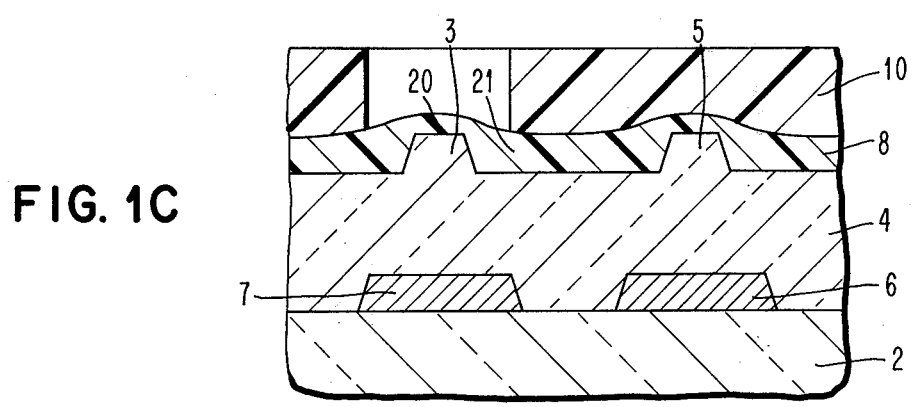

A photoresist layer 10 is then applied, selectively exposed and developed to form a mask for subsequent processing. This step is required to open via holes at selected regions above the thin film pattern. Layer 10 is patterned using standard photo or electron beam-lithographic techniques to expose those portions of polymer 8 which are disposed over selected stripes to which via holes are to be formed. Thus, in FIG. 1C, a via hole is to be made down to stripe 7, but not stripe 6, through layer 8 and glass 4.

Figure 1D:
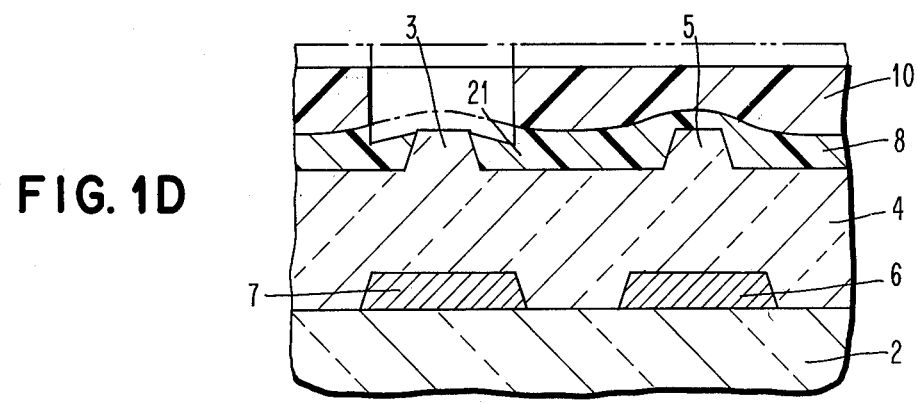

Next, the thin portion 20 of polymer 8 atop protuberance 3 is removed while not substantially affecting photoresist 10 or the thicker portions 21 of polymer 8. Such removal may be accomplished by a plasma etching step either in a sputtering chamber using, e.g., an oxygen gas ambient or in an asher-type system such as in manufactured by L.F.E. Corp. or I.P.C. Corp. As shown in FIG. 1D, surface portions of layers 10 and 21 are also removed, but in insufficient quantities to affect their masking properties.

Figure 1E:
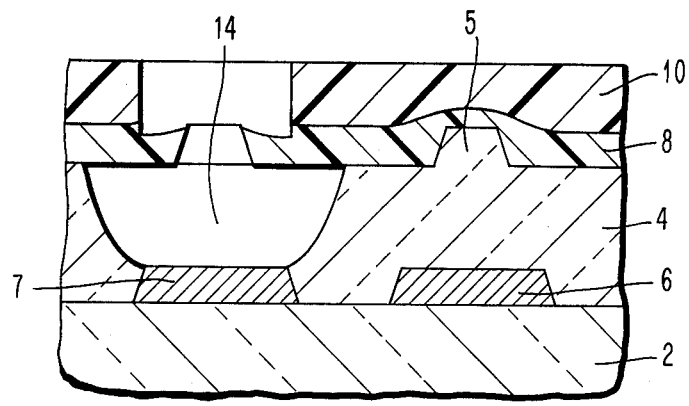

Glass 4 is thereby exposed; and the exposed portions are removed by a conventional wet etching process to open via hole 14 atop stripe 7 as is shown in FIG. 1E. It is important that the etchant used to remove dielectric 4 be one which does not substantially attack either of layers 8 or 10. Buffered hydrofluoric acid is a conventional etchant which attacks the glass isotropically but which does no attack developed photoresist.

Figure 1F:
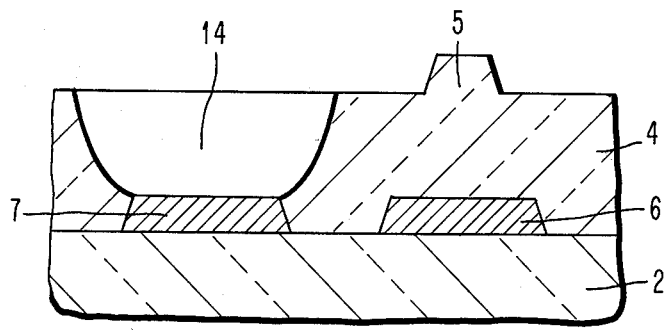
Figure 1G:
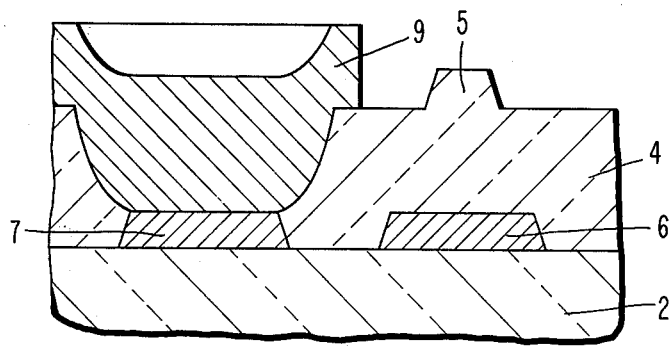

The remaining portions of polymer 8 and photoresist 10 are removed in a standard resist removal process to completely expose via hole 14 atop stripe 7 as in FIG. 1F. A second level of metallization 9 is then deposited as a via connection in a via hole 14, as shown in FIG. 1G, to interconnect the first level of metallization represented by stripe 7 to the second level of metallization represented by stripe 9. The deposition step may be accomplished either by the lift-off processes previously discussed or by a blanket deposition followed by subtractive etching. This completes our preferred process. It should be noted that the process has achieved a "zero-overlap" via in that the width of metallization 9 is equal to the width of stripe 7 at their contact interface. In addition, there are no adverse effects around the stripes, such as tunneling.

Moreover, there is a significant reduction of mask defects because the underlying polymer 8 affords an extra layer of protection against particulates or mask defects.

As mentioned in the Summary of the Invention, our process has the advantage of insuring that the via holes are aligned with their associated conductive stripes irrespective of whether photoresist mask 10 is properly positioned or not. To illustrate this feature, reference is made to FIGS. 2A-2G, which are essentially repetitions of FIGS. 1A-1G with the exception that the photoresist mask is misaligned. To avoid confusion, the numbering of the various parts of the structure remains the same, with the exception that each number is primed as a distinction.

Figure 2A:
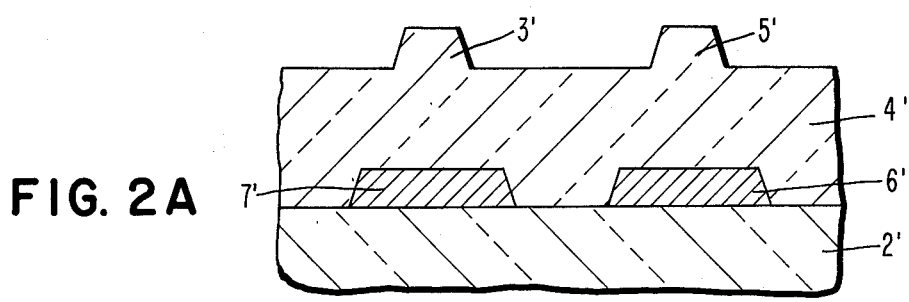
FIGS. 2A–2G are similar views of a process in which the photoresist mask is misaligned.

In FIG. 2A conductive stripes 6' and 7' are disposed on substrate 2, with glass layer 4' disposed overall.

Figure 2B:
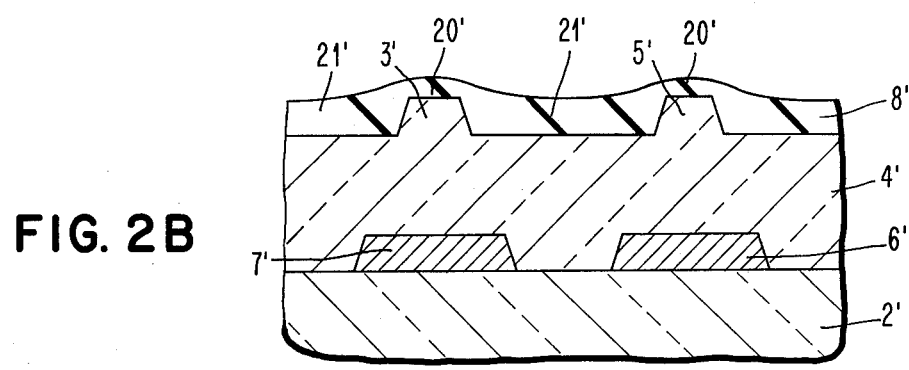

Polymer 8' is then spun-on atop layer 4' in FIG. 2B with the polymer having a greater thickness at regions 21' between protuberances 3' and 5' than atop the protuberances at regions 20'.

Figure 2C:
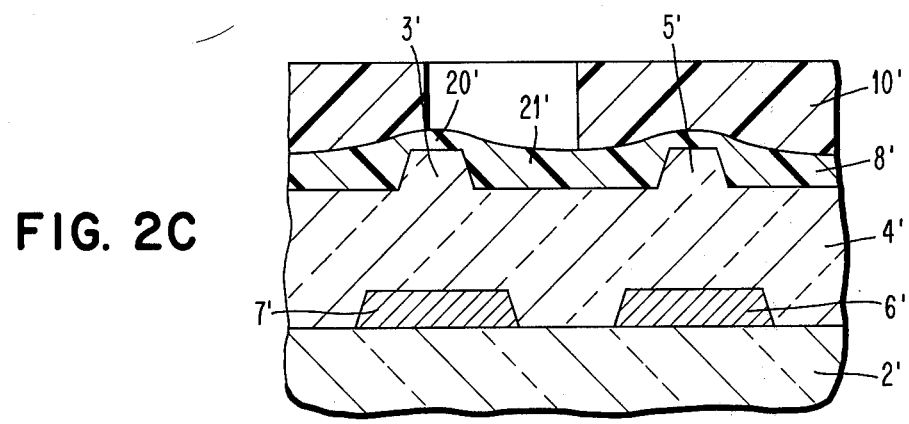

In FIG. 2C photoresist 10' is applied, exposed and developed; however the masking step is shown to have resulted in a relatively severe misalignment. The misalignment, which is in the order of 0.1 mils, is not uncommon in semiconductor processing, but usually results in a product of a marginal quality. Without the presence of polymer 8', the etching of glass 4' with such a mask misalignment may result in the complete removal of dielectric 4' between stripes 6' and 7'.

Figure 2D:
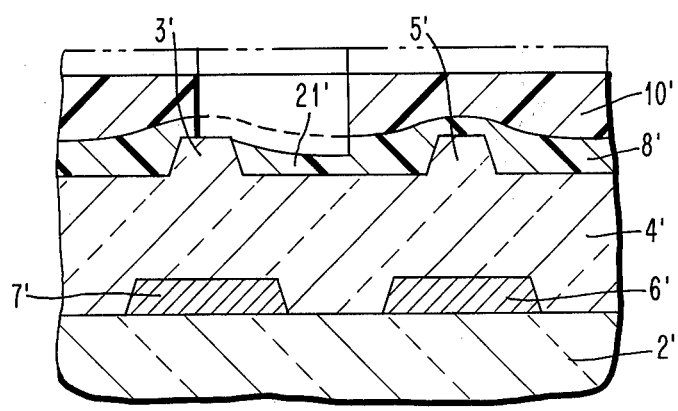
Figure 2E:
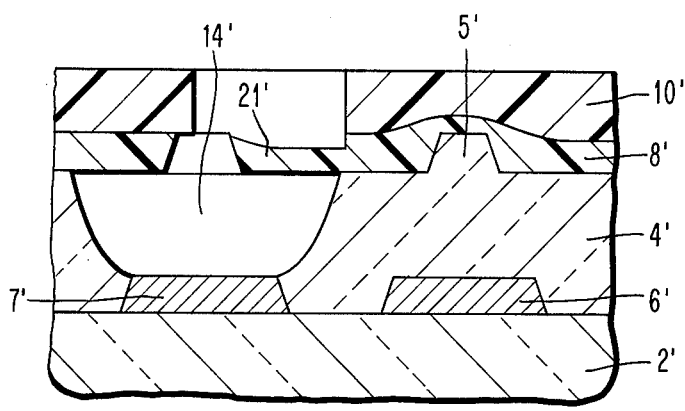

The exposed thin portion 20' of polymer 8' atop protuberance 3' can be removed by a reactive sputter etching step so as to expose a portion of protuberance 3'. This limited exposure, which is illustrated in FIG. 2D, is sufficient for the subsequent chemical etching of glass 4' down to stripe 7' to form window 14' in FIG. 2E.

Figure 2F:
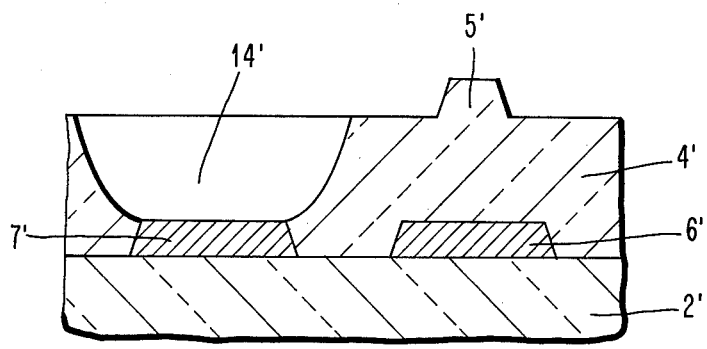
Figure 2G:
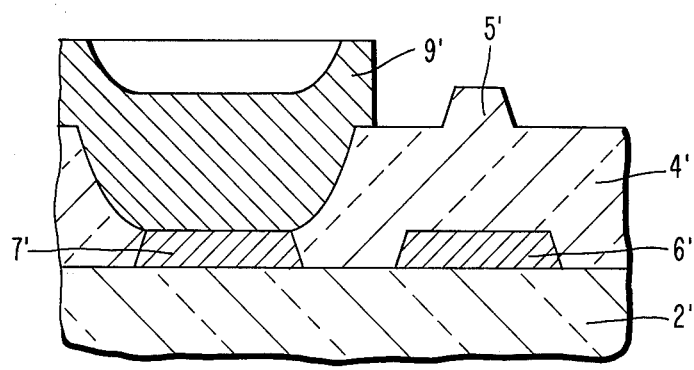

The remaining portions of layers 8' and 10' are removed in the standard resist removal process to completely expose via hole 14' atop stripe 7' as in FIG. 2F. A second level of metallization 9' is then deposited into via hole 14' as shown in FIG. 2G to interconnect the first level of metallization with the second level of metallization.

Figure 3:
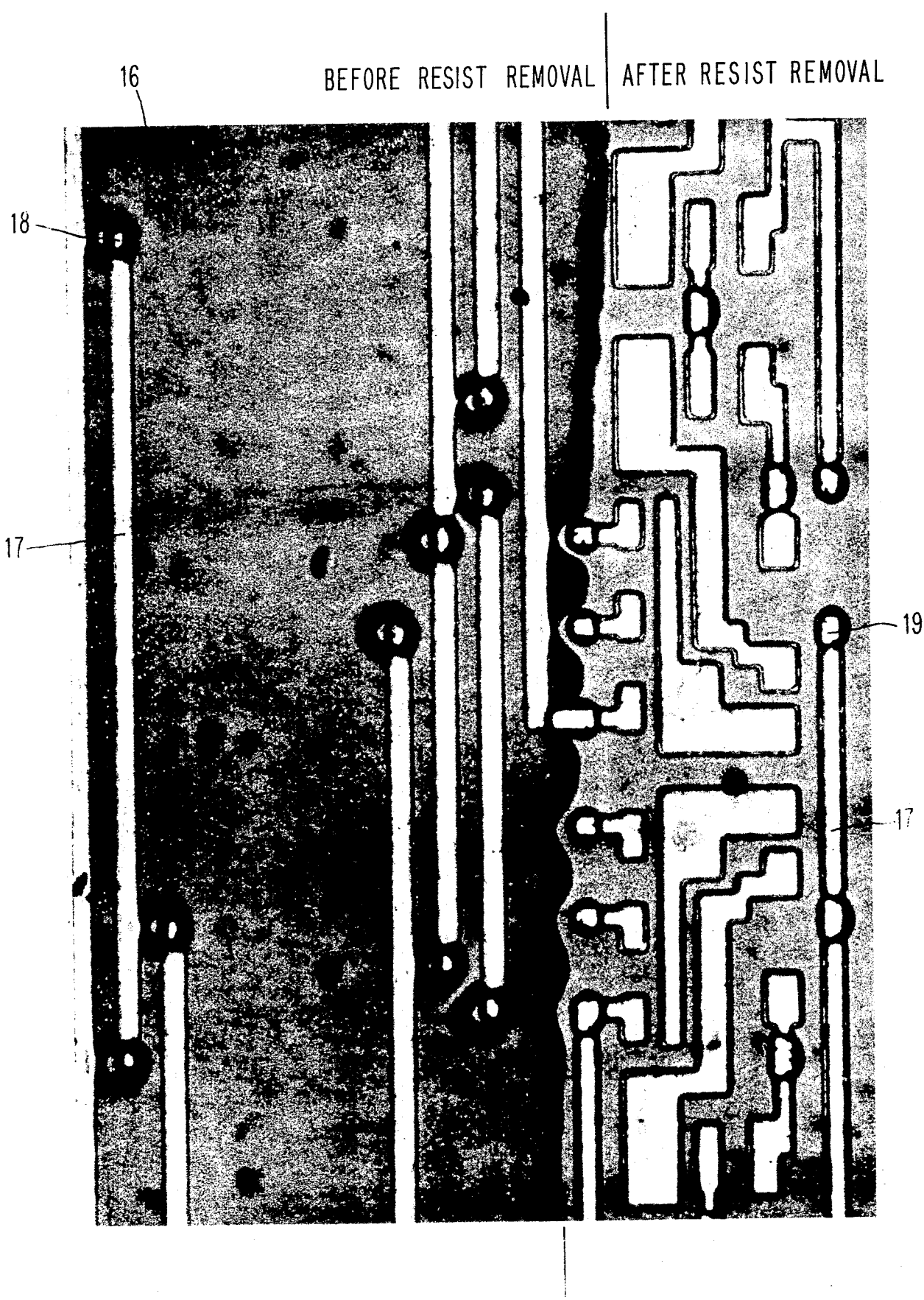
FIG. 3 is a reproduction of a photograph which demonstrates that the via holes are aligned with the thin film pattern even though the mask is misaligned.

Reference is made to FIG. 3 which illustrates the effectiveness of our process. FIG. 3 is a surface view of a portion of a semiconductor chip in which photoresist mask 16 has been misaligned. The glass in the via holes has been etched away. The resist was subsequently removed from the right-hand side of the chip portion. Misalignment is evident on the left-hand side, but the vias are perfectly aligned on the right-hand side.

On the left side of FIG. 3 the openings 18 in the mask 16 are offset from conductive stripes 17. This picture corresponds to the step illustrated in FIG. 2E above. Ordinarily, in standard processes after the removal of photoresist 16, the via holes would maintain the misalignment so that poor contact would be made from the via metallization deposited in the via holes with the conductive stripes.

The right-hand side of the photograph shows, however, that this is not the case with our process. This picture corresponds to the step illustrated in FIG. 2F above. It can be seen that the via holes 19 are in perfect alignment with conductive stripes 17.

While the invention has been particularly shown and described with reference to preferred embodiments thereof, it will be understood by those skilled in the art that the foregoing and other changes in form and details may be made therein without departing from the spirit and scope of the invention. For example, although we have described the preferred embodiment in terms of glass or silicon dioxide as the dielectric material, other conventional dielectrics such as silicon nitride could be used as well. In addition, the invention is not restricted to the use of conventional photoresists as masks.

We claim:

1. A method for forming via holes atop selected regions of a thin film pattern of raised thin film stripes disposed on a substrate comprising the steps of:
    depositing a dielectric material atop said stripes and said substrate, the topology of said dielectric material including protuberances conforming to said stripes;
    depositing a second material atop said dielectric material, which fills in the regions between said protuberances to a greater thickness than atop said protuberances;
    said material being insensitive to exposure;
    forming, on said second material, a masking layer having openings over selected protuberances, thereby exposing portions of said second material;
    removing those portions of said second material which are disposed above said selected protuberances while not substantially affecting those portions of said second material disposed in the regions between said protuberances; and
    etching said dielectric material through the openings in said second material with an etchant which does not substantially attack said second material or said masking layer, thereby forming said via holes.

2. A method as in claim 1 wherein said second material is a polymer which is initially sensitive to exposure and said deposition step comprises the steps of:
    depositing said polymer in liquid form; and
    baking said polymer at a temperature sufficient to render it insensitive to exposure.

3. A method as in claim 2 wherein said polymer is a photoresist and the removal of said portions of said photoresist above said protuberances is accomplished by plasma etching.

4. A method as in claim 3 wherein said masking layer is a photoresist.

5. A method as in claim 1 wherein the deposition of said dielectric material is accomplished by sputtering.

6. A method as in claim 5 wherein said sputtering step includes the resputtering of said dielectric material, whereby the width of said protuberances is less than the width of said stripes.

7. A method as in claim 1 further comprising the steps of:
    removing said second material and said masking layer; and
    forming via connections within said via holes.

8. A method as in claim 1 wherein said via holes are at least as wide as said stripes.

9. A method as in claim 8 further comprising the steps of:
    removing said second material and said masking layer; and
    forming via connections within said via holes, whereby said via connections are at least as wide as said stripes.

10. A method for forming self-aligned via holes atop selected regions of raised conductive stripes disposed on a substrate comprising the steps of:
    sputtering glass atop said stripes and said substrate, the topology of said glass including protuberances conforming to said stripes;
    depositing a polymer which is sensitive to exposure atop said dielectric material, which fills in the regions between said protuberances to a greater thickness than atop said protuberances;
    rendering said polymer insensitive to exposure;
    forming, on said polymer, a masking layer having openings over selected protuberances, thereby exposing portions of said polymer;
    removing those portions of said polymer which are disposed above said selected protuberances by plasma etching while not substantially affecting those portions of said polymer disposed in the regions between said protuberances; and
    etching said glass through the openings in said polymer with an etchant which does not substantially attack said polymer or said masking layer, thereby forming said via holes.

11. A method as in claim 10 wherein said sputtering step includes the resputtering of said glass, whereby the width of said protuberances is less than the width of said stripes.

12. A method as in claim 10 further comprising the steps of:
    removing said polymer and said masking layer; and
    forming via connections within said via holes.

13. A method as in claim 10 wherein said via holes are at least as wide as said stripes.

14. A method as in claim 13 further comprising the steps of:
    removing said polymer and said masking layer; and
    forming via connections within said via holes, whereby said via connections are at least as wide as said stripes.

* * * * *